(12) United States Patent
Balakrishnan et al.

(10) Patent No.: US 9,362,383 B1
(45) Date of Patent: Jun. 7, 2016

(54) HIGHLY SCALED TUNNEL FET WITH TIGHT PITCH AND METHOD TO FABRICATE SAME

(71) Applicant: International Business Machines Corporation, Armonk, NY (US)

(72) Inventors: Karthik Balakrishnan, White Plains, NY (US); Kangguo Cheng, Schedectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/856,811

(22) Filed: Sep. 17, 2015

(51) Int. Cl.
| | |
|---|---|
| H01L 21/335 | (2006.01) |
| H01L 29/66 | (2006.01) |
| H01L 29/165 | (2006.01) |
| H01L 29/78 | (2006.01) |
| H01L 29/51 | (2006.01) |
| H01L 21/84 | (2006.01) |
| H01L 29/10 | (2006.01) |

(52) U.S. Cl.
CPC .......... H01L 29/6653 (2013.01); H01L 29/165 (2013.01); H01L 29/78 (2013.01); H01L 29/785 (2013.01); H01L 21/84 (2013.01); H01L 29/1054 (2013.01); H01L 29/517 (2013.01); H01L 29/66545 (2013.01)

(58) Field of Classification Search
CPC ................... H01L 29/66545; H01L 29/66628; H01L 29/66561; H01L 29/1054; H01L 21/84; H01L 29/165; H01L 27/1203; H01L 29/66772; H01L 29/78687; H01L 29/78969; H01L 29/0642; H01L 29/517; H01L 29/785

USPC ................. 438/142, 141, 149, 251, 380, 591; 257/9, 38, 105, 345, E27.06, E29/027
See application file for complete search history.

(56) References Cited

U.S. PATENT DOCUMENTS

| | | | |
|---|---|---|---|
| 6,642,090 | B1 | 11/2003 | Fried et al. |
| 6,660,596 | B2 | 12/2003 | Adkisson et al. |
| 6,921,982 | B2 | 7/2005 | Joshi et al. |

(Continued)

FOREIGN PATENT DOCUMENTS

| | | |
|---|---|---|
| CN | 103545204 A | 1/2014 |
| CN | 103871887 A | 6/2014 |

(Continued)

*Primary Examiner* — Thinh T Nguyen
(74) *Attorney, Agent, or Firm* — Harrington & Smith; Louis J. Percello

(57) ABSTRACT

A structure includes a substrate and a tunnel field effect transistor (TFET). The TFET includes a source region disposed in the substrate having an overlying source contact, the source region containing first semiconductor material having a first doping type; a drain region disposed in the substrate having an overlying drain contact, the drain region containing second semiconductor material having a second, opposite doping type; and a gate structure that overlies a channel region between the source and the drain. The source region and the drain region are asymmetric with respect to one another such that one contains a larger volume of semiconductor material than the other one. A method is disclosed to fabricate a plurality of the TFETs using a plurality of spaced apart mandrels having spacers. A pair of the mandrels and the associated spacers is processed to form four adjacent TFETs without requiring intervening lithographic processes.

15 Claims, 5 Drawing Sheets

(56) References Cited

U.S. PATENT DOCUMENTS

| | | |
|---|---|---|
| 7,064,019 B2 | 6/2006 | Fried et al. |
| 7,198,990 B2 | 4/2007 | Joshi et al. |
| 7,700,466 B2 | 4/2010 | Booth, Jr. et al. |
| 8,441,000 B2 * | 5/2013 | Chen ............... H01L 29/165 257/30 |
| 8,629,500 B2 * | 1/2014 | Holz ............... 257/315 |
| 8,686,506 B2 | 4/2014 | Chang et al. |
| 8,722,498 B2 | 5/2014 | Scheiper et al. |
| 2015/0001628 A1 | 1/2015 | Licausi et al. |
| 2015/0008488 A1 | 1/2015 | Hall et al. |
| 2015/0028454 A1 | 1/2015 | Cheng et al. |

FOREIGN PATENT DOCUMENTS

| | | |
|---|---|---|
| CN | 104425593 A | 3/2015 |
| CN | 104425606 A | 3/2015 |

* cited by examiner

HIGHLY SCALED TUNNEL FET WITH TIGHT PITCH AND METHOD TO FABRICATE SAME

TECHNICAL FIELD

The various embodiments of this invention relate generally to semiconductor devices and fabrication techniques and, more specifically, relate to the fabrication of semiconductor transistor devices that can be referred to as tunnel field effect transistors (TFETs).

BACKGROUND

A basic TFET structure can be similar to a metal oxide semiconductor field effect transistor (MOSFET) structure except that the source and drain terminals of the TFET are doped of opposite type. That is, the TFET is an asymmetric device as compared to a symmetric MOSFET device. One conventional TFET device structure contains a P-I-N (p-type-intrinsic-n-type) junction, where the electrostatic potential of the intrinsic region is controlled by a gate terminal.

TFETs have the potential to serve as a viable option for extremely low power applications. However, unlike the conventional MOSFET in which the source and drain are symmetric, and can be readily formed to be self-aligned to the gate structure, due the TFET requirement to have different source and drain polarities it can be extremely challenging to form the different source and drain with a small gate length when using the conventional lithography. This is due at least to the presence of a reduced process window for mask placement with the small gate length. Another challenge relates to forming TFETs with a tight pitch (i.e., close spacing between TFETs).

SUMMARY

In a first aspect thereof the embodiments of this invention provide a method to fabricate a plurality of field effect transistors (FETs) each having a source region, a drain region, and a gate that overlies a channel region disposed between the source region and the drain region. The method comprises forming a plurality of spaced apart mandrels on a top surface of a substrate; forming spacers on sidewalls of the mandrels, the spacers each having an inner sidewall disposed on a sidewall of a mandrel and an outer sidewall; and forming first recesses through the top surface of the substrate, where each recess extends from an outer sidewall of a first spacer to an outer sidewall of an adjacent spacer. The method further comprises filling the first recesses with source material and covering the source material with first dielectric material; removing the mandrels and forming, where the mandrels are removed, second recesses through the top surface of the substrate; filling the second recesses with drain material and covering the drain material with second dielectric material; and removing the spacers to form a plurality of openings to expose a portion of the top surface of the substrate, where each opening has sidewalls defined by the first and second dielectric material. The method further comprises forming in each opening a gate structure on the sidewalls of the first and second dielectric material and on an exposed portion of the top surface of the substrate; removing the first and second dielectric material and depositing, where the first and the second dielectric material is removed, source and drain contacts to the source material and the drain material, respectively.

In another aspect thereof the embodiments of this invention provide a structure that comprises a substrate and a tunnel field effect transistor comprised of a source region disposed in the substrate and having an overlying source contact, the source region comprised of first semiconductor material having a first doping type, a drain region disposed in the substrate and having an overlying drain contact, the drain region comprised of second semiconductor material having a second doping type opposite the first doping type, and a gate structure that overlies a channel region disposed between the source region and the drain region. In the structure the source region and the drain region are asymmetric with respect to one another and one of the source region and the drain region contains a larger volume of semiconductor material than the other one of the source region and drain region.

In yet another aspect thereof the embodiments of this invention provide a method to fabricate a plurality of TFETs. The method comprises forming on a surface of a semiconductor substrate a plurality of spaced apart mandrels each having associated spacers and processing a pair of the mandrels and the associated spacers to form four adjacent TFETs without requiring use of intervening lithographic processes. In accordance with the method two adjacent TFETs share a common source or a common drain.

BRIEF DESCRIPTION OF THE SEVERAL VIEWS OF THE DRAWINGS

FIG. 1 illustrates a starting structure (starting wafer) that includes a semiconductor substrate, a plurality of mandrels on the top surface of the substrate and spacers formed on sidewalls of the mandrels;

FIG. 2 shows the structure of FIG. 1 after forming recesses into the substrate and in-situ doped P+ sources in the recesses;

FIG. 3 shows the structure of FIG. 2 after applying an oxide fill to cover the P+ sources and performing a CMP;

FIG. 4 shows the structure of FIG. 3 after removal of the mandrels, forming recesses into the substrate 10, and the epitaxial growth of in-situ doped N+ drains in the recesses;

FIG. 5 shows the structure of FIG. 4 after applying a second oxide fill to cover the in-situ doped N+ drains and after etching the spacers to form openings used in FIG. 6 for forming gate structures;

FIG. 6 shows the structure of FIG. 5 after lining the openings with a gate dielectric and filling the openings with a gate conductor fill, followed by removal of the oxide fills; and FIG. 7 shows the structure of FIG. 6 after forming gate spacers and depositing source contact metal and drain contact metal.

FIG. 8 shows an alternate embodiment wherein, for example, the sources are provided with a "sigma" volumetric shape to impart strain on the channel that underlies the gate fill.

FIG. 9 shows an alternate embodiment where asymmetric MOSFET devices, as opposed to TFET devices, are fabricated in accordance with embodiments of this invention.

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LPCVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 350° C. to about 900° C. Although higher temperature will typically result in faster deposition of the semiconductor material, the faster deposition may also result in crystal defects and film cracking.

The embodiments of this invention provide a method for forming, in a self-aligned manner, highly scaled TFETs with small gate length and tight pitch that is beyond the currently available capability of conventional lithography.

Figure 1:
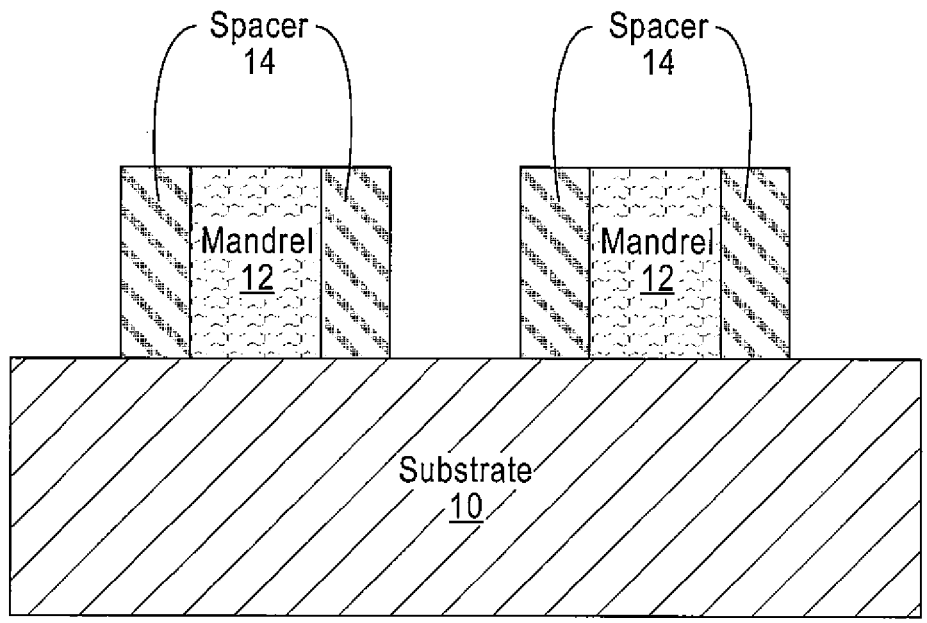
FIGS. 1-9 are each an enlarged cross-sectional view showing various initial, intermediate and completed or substantially completed structures that are fabricated in accordance with embodiments of this invention, wherein the various layer thicknesses and other dimensions are not necessarily drawn to scale. More specifically.

FIG. 1 shows an initial starting structure having a semiconductor substrate 10, such as a Si substrate (e.g., a <100> Si substrate). The method can form shallow trench isolation (STI, not shown) in the substrate 10 to delineate active regions. The method forms sacrificial mandrels 12 (e.g., composed of amorphous carbon (aC)) on the top surface of the substrate 10. In other embodiments the mandrels 12 could be composed of some other dielectric material such as a nitride (e.g., $Si_3N_4$), or an oxide (e.g., $SiO_2$). The mandrels 12 can be formed using a mask having openings where the mandrels 12 are desired to be positioned and a CVD process to deposit the aC, followed by a removal of the mask and any overlying aC material. The mandrels 12 have a width that is related to a desired width of a TFET source region such as, in a non-limiting example, a width in a range of about 10 nm to about 30 nm. Next spacers 14 (e.g., nitride such as, e.g., $Si_3N_4$) are formed in a conventional manner on sidewalls of the mandrels 12. The thickness of the spacers 14 is related to a desired gate length dimension, for example, a gate length in a range of about 10 nm to about 30 nm, with about 20 nm being one suitable but non-limiting value. One consideration when selecting the material for mandrels 12 is that the mandrels 12 can be subsequently removed by a process that is selective to the spacers 14 and the substrate 10. In the exemplary case of aC mandrels 12 and nitride spacers 14 on the Si substrate 10, the mandrels can be subsequently removed (see FIG. 4) with a plasma etch. Although for convenience two mandrels 12 are shown in FIG. 1, it should appreciated that some thousands or millions of mandrels could be formed in a one or a two dimensional array on the surface of the substrate 10.

Figure 2:
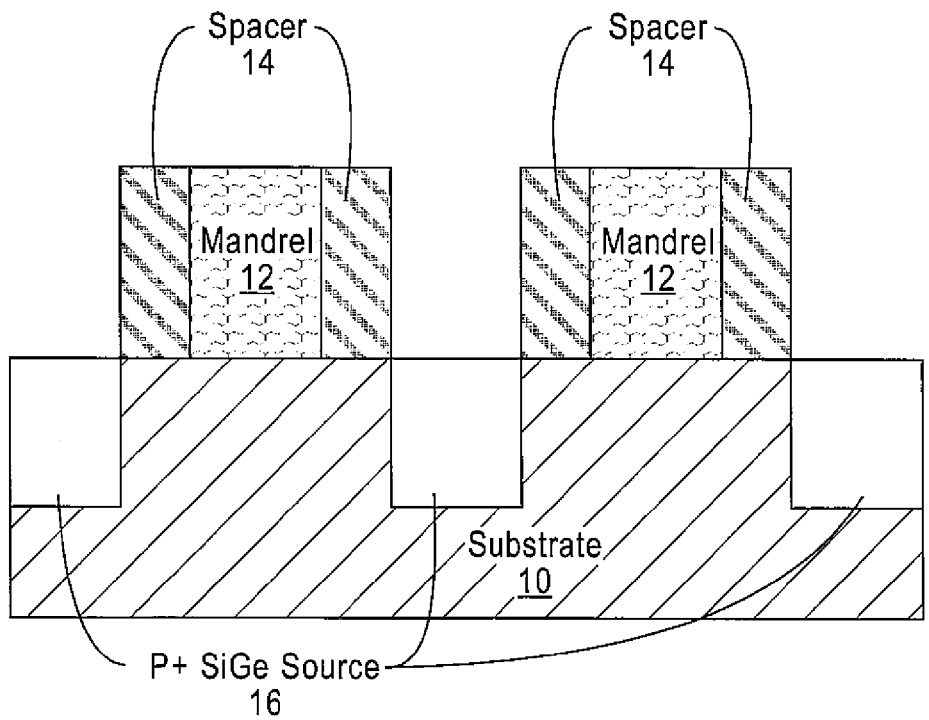

FIG. 2 shows the structure of FIG. 1 after forming recesses into the substrate 10 to a depth in an exemplary range of about 30 nm to about 50 nm. The recesses can be self-aligned with the mandrels 12 and spacers 14 are formed so as to be adjacent to the outer sidewalls of the spacers 14 and can be self-aligned with the spacers. The method then forms P+ sources 16. This can be accomplished by, as one non-limiting example, epitaxially depositing in-situ Boron doped SiGe (SiGe:B) into the recesses. The Boron dopant concentration can be in a range of about, for example, $10^{18}$-$10^{21}$ (or greater) atoms/$cm^3$. It can be noted that this process can be similar in some respects to that used with embedded SiGe (eSiGe) in CMOS structures, except that the in-situ doped SiGe is grown only on what will be the source sides of the TFETs being formed.

Figure 3:
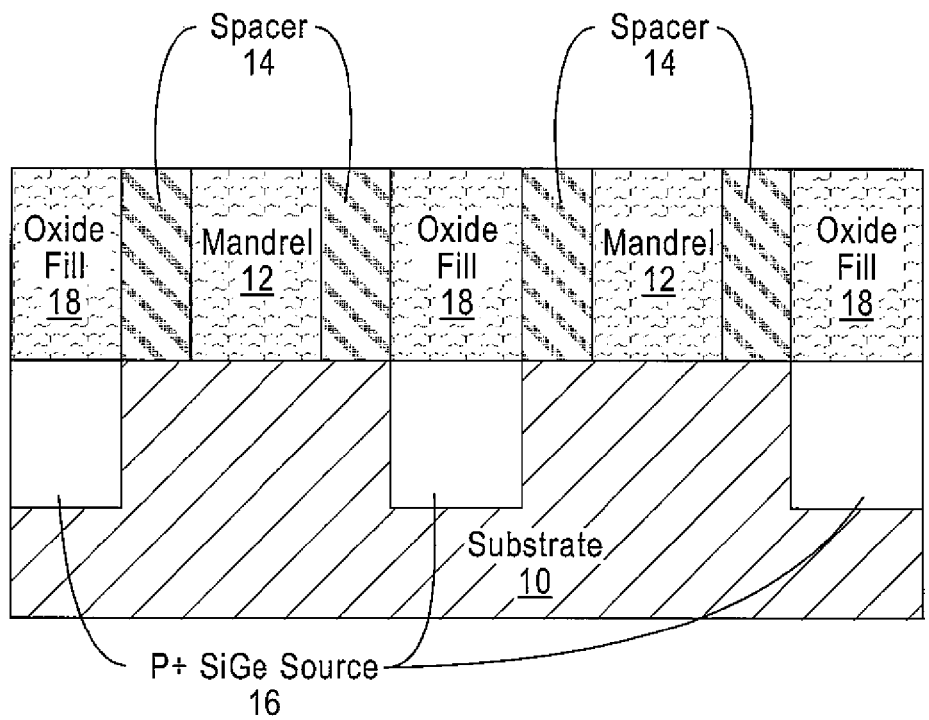

FIG. 3 shows the structure of FIG. 2 after applying an oxide fill 18 to cover the SiGe sources 16 and then performing a chemical mechanical polish (CMP) procedure to planarize the top surface of the structure.

Figure 4:
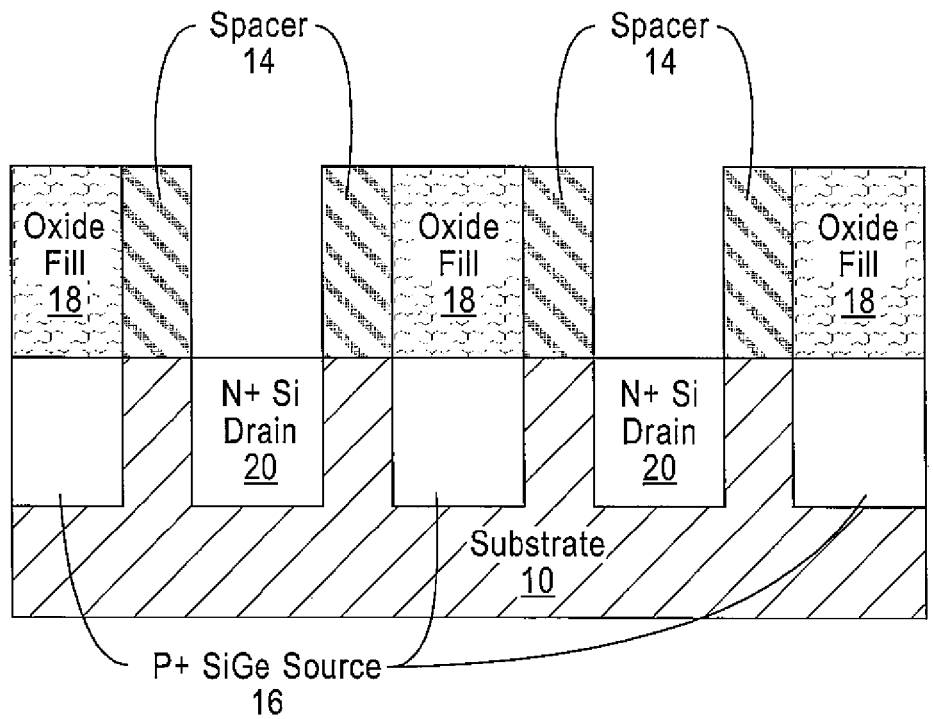

FIG. 4 shows the structure of FIG. 3 after removing the aC mandrels 12 by using, for example, a plasma such as a plasma oxygen etch, forming recesses into the substrate 10, and then epitaxially growing N+ drains 20 in the recesses. The recesses can be etched into the substrate 10 to a depth comparable to the depth of the recesses used to form the P+ sources 16, i.e., in an exemplary range of about 30 nm to about 50 nm, although there is no requirement that both the source and drain extend to the same depth in the substrate 10. The recesses in this case are formed so as to be adjacent to the inner sidewalls of the spacers 14 after removal of the mandrels 12 and can be self-aligned with the spacers 14. The method then forms the N+ drains 20. This can be accomplished by, as one non-limiting example, epitaxially depositing in-situ Phosphorus doped Si (Si:P) into the recesses. The Phosphorus dopant concentration can be in a range of about, for example, $10^{18}$-$10^{21}$ (or greater) atoms/$cm^3$. The in-situ N+ doped Si is grown only on what will be the drain sides of the TFETs being formed, it being remembered that TFETs are asymmetric devices as compared to conventional CMOS devices.

Figure 5:
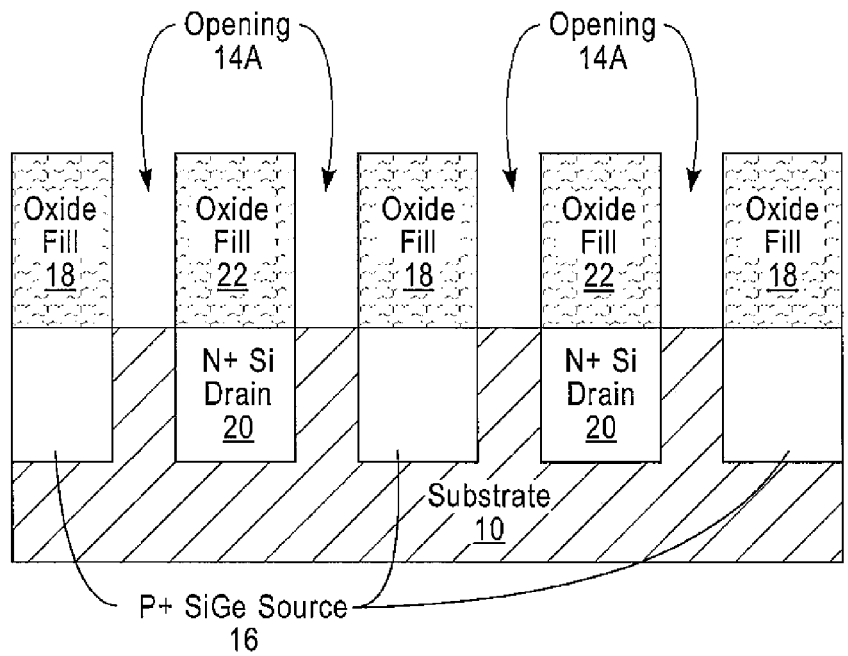

FIG. 5 shows the structure of FIG. 4 after applying a second oxide fill 22 to cover the in-situ doped N+Si drains 20. A CMP procedure may then be used to planarize the top surface of the structure. FIG. 5 also shows the structure after etching the nitride spacers 14, where the etch process is selective to the surrounding oxide 18 and 22 and the substrate 10. The resulting openings 14A that extend to the top surface of the substrate 10, where the spacers 14 are removed, will be used subsequently in FIG. 6 for forming gate structures. One suitable, but non-limiting, selective etching technique to etch $Si_3N_4$ spacers 14 selectively to the oxide fills 18 and 22 and the Si substrate 10 is based on a reactive ion etch (RIE) using, for example, a fluorine containing mixture such as $CF_4/H_2$, $CF_4/O_2/N_2$, $SF_6/O_2/N_2$, $SF_6/CH_4/N_2$ and $SF_6/CH_4/N_2/O_2$.

Figure 6:
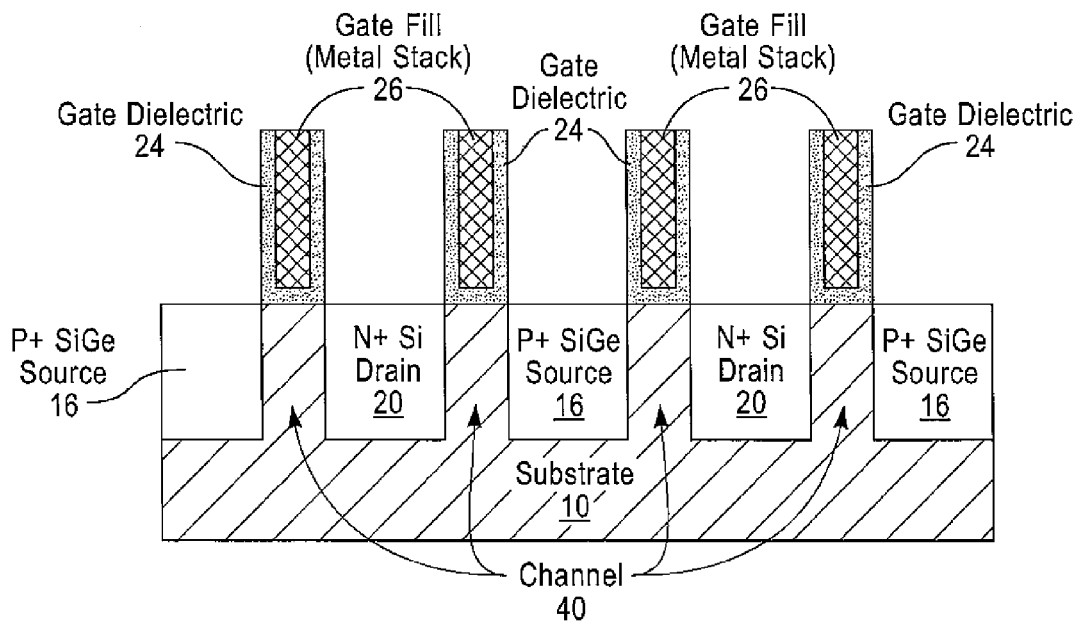

FIG. 6 shows the structure of FIG. 5 after lining the openings 14A with a gate dielectric 24 and then filling the openings 14A with a gate fill 26, followed by removal of the oxide fills 18 and 22. As non-limiting examples, this can be achieved by depositing the gate dielectric 24 as a layer of high dielectric constant (high-k) material comprising a dielectric metal oxide and having a dielectric constant that is greater than the dielectric constant of silicon nitride (7.5). The high-k dielectric layer may be formed by methods well known in the art including, for example, CVD, atomic layer deposition (ALD), molecular beam deposition (MBD), pulsed laser deposition (PLD) and liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently established from about 0.5 to about 3.0 and each value of y is independently established from about 0 to about 2.0. The thickness of the high-k dielectric layer may be from about 1 nm to about 10 nm, and more preferably from about 1.5 nm to about 3 nm. The high-k dielectric layer can have an effective oxide thickness (EOT) on the order of, or less than, about 1 nm. The gate fill 26 can be a metal or a metal system that is deposited directly on a top surface of the high-k dielectric layer 24 by, for example, CVD, physical vapor deposition (PVD), or atomic layer deposition (ALD). As non-limiting examples the gate fill (metal) 26 can include a metal system selected from one or more of TiN, TiC, TaN, TaC, TaSiN, HfN, W, Al and Ru.

As should be appreciated, at this point in the exemplary fabrication process described thus far there exist four TFET precursor structures, each of which is defined by a gate structure that overlies a channel 40 in the Si substrate 10, where the gate structure is comprised of the gate dielectric 24 and gate fill (metal) 26, that are derived from the two mandrels 12 (density doubling), where the TFETs further include the SiGe:B and Si:P source/drains 16 and 20 disposed in the Si substrate 10 adjacent to the channel 40. As should also be appreciated, this structure can be formed without relying on any intervening lithography step or steps subsequent to the mandrel and mandrel spacer definition.

If one assumes as exemplary values that a desired gate length is about 20 nm and that the source and the drain each have a desired width of about 20 nm, although there is no requirement that both the source and the drain have the same width, then in the non-limiting example depicted in FIG. 1 the vertical side wall of one mandrel 12 could be spaced part from the opposing vertical sidewall of the adjacent mandrel 12 by about 60 nm.

Figure 7:
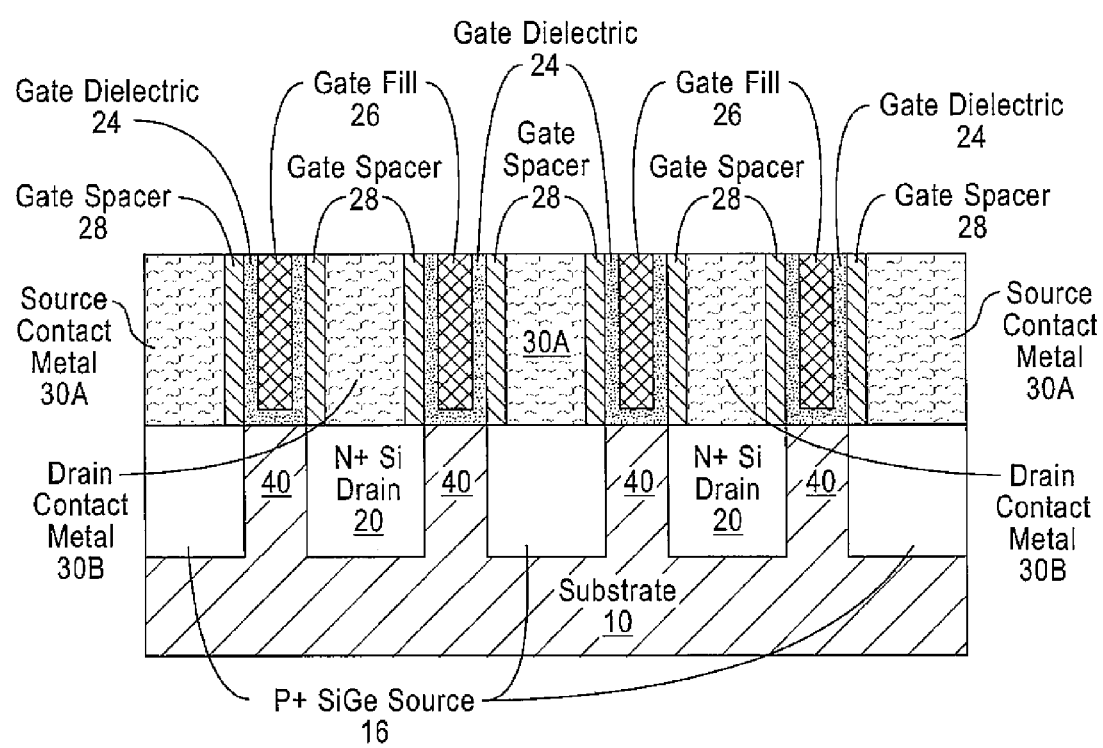

FIG. 7 shows the structure of FIG. 6 after forming gate spacers 28 and depositing source contact metal 30A and drain contact metal 30B. The spacers 28 could be comprised of SiBCN applied by, for example, CVD or ALD, or the spacers could be comprised of any other suitable dielectric material such as a nitride, including BN, or an oxide. The contact metal 30A, 30B can be any conventional contact metal/metal system including, as non-limiting examples, Al, TiN and W. A CMP can be performed subsequent to the contact metal deposition. Additional further processing can include, for example, forming one or more dielectric layers, adding gate contacts and forming vertical and horizontal conductive interconnects, as is known in the art, to connect the TFETs into a desired circuit configuration.

As can be seen in FIG. 7 a method forms on the surface of the semiconductor substrate 10 a plurality of the spaced apart mandrels 12 each having the associated spacers 14, and processes a pair of the mandrels and the associated spacers to form four adjacent TFETs without requiring use of an intervening lithographic process or processes. In the method in accordance with the exemplary embodiments of this invention two adjacent TFETs share a common source 16 or a common drain 20.

Figure 8:
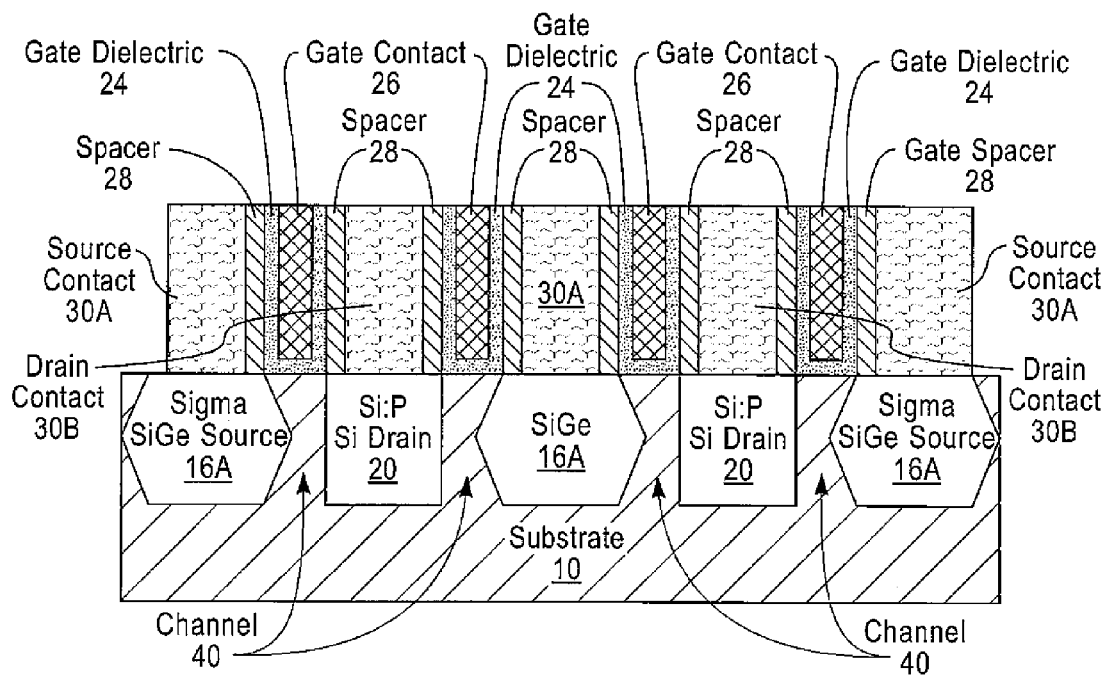

FIG. 8 shows an alternate embodiment wherein, for example, the sources 16 are provided with a "sigma" shape to impart strain on the channel 40 that underlies the gate fill 26. An anisotropic etch that serves to remove more of the substrate 10 volume than the embodiment of FIG. 2 thereby enables the resulting deposited source 16A to have a larger volume directed towards the channel 40, and to thus apply proportionally more strain to the Si channel. If one assumes for convenience a <100> crystalline orientation of the substrate 10 then the anisotropic etch stops at the <111> plane. The resulting "sigma" substrate recess profile can be achieved by first etching partially downwards into the substrate 10 to form a substantially rectangular box shaped recess and then performing, as a non-limiting example, a chemical etch using Tetramethylammonium hydroxide (TMAH) to impart the sigma shape to the resulting void that will be subsequently filled with the P-type source material. As can be noted, this embodiment of the method forms recesses so as to have non-vertical sidewalls that are configured, when the recesses are filled with the source material, to apply stress to an adjacent region of the semiconductor substrate wherein the TFET channel 40 is located. In another embodiment the drains can be etched instead so as to have the sigma shape.

As should be appreciated, the use of this invention decouples the formation of the TFET source from the formation of the TFET drain and enables the source and the drain to be asymmetric with respect to one another where, for example, the volume of the semiconductor material in the source region, having the first doping type, can be different than the volume of semiconductor material in the drain region, having the second doping type.

Further, the embodiments of this invention can also be used for forming asymmetric MOSFET devices (e.g., low resistance (more gate-to-source) source and lower parasitic capacitance (less gate-to-drain overlap and/or more halo 32 on the drain side).

Figure 9:
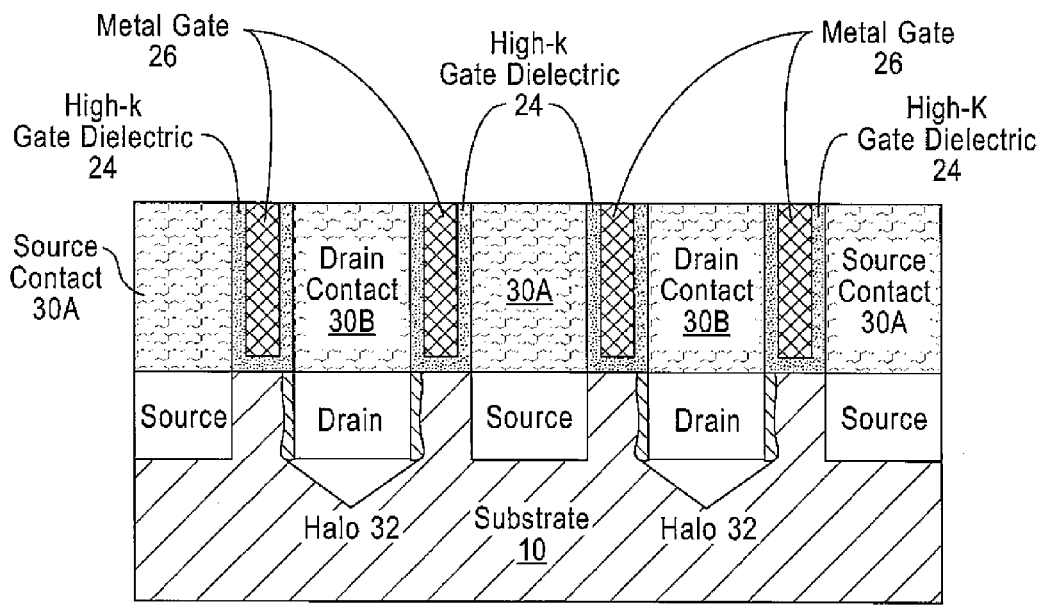

FIG. 9 shows an example of a MOSFET, as opposed to a TFET, embodiment that can benefit from the teachings of this invention. For example, while the source and the drain can both be either P-type or N-type as is conventional, they could be comprised of different materials and/or the overlap of one with the gate can be greater than the overlap of the other. Further by example, the substrate 10 could be a low bandgap material and a higher bandgap material can be used for the drain to control leakage.

It is noted that any one of the structures shown in FIGS. 1-8 could be viewed as an intermediate structure formed during the overall process of providing the plurality of TFETs.

It is to be understood that although the exemplary embodiments discussed above with reference to FIGS. 1-9 can be used on common variants of the FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes and etching processes may be used by those skilled in the art. Further, the exemplary embodiments are not intended to be limited to only those materials, metals, insulators, dopants, dopant concentrations, layer thicknesses, spacings and the like that were specifically disclosed above. Any and all such and similar modifications of the teachings of this invention will still fall within the scope of this invention.

What is claimed is:

1. A method to fabricate a plurality of field effect transistors (FETs) each having a source region, a drain region, and a gate that overlies a channel region disposed between the source region and the drain region, the method comprising:
    forming a plurality of spaced apart mandrels on a top surface of a substrate;
    forming spacers on sidewalls of the mandrels, the spacers each having an inner sidewall disposed on a sidewall of a mandrel and an outer sidewall;
    forming first recesses through the top surface of the substrate, each recess extending from an outer sidewall of a first spacer to an outer sidewall of an adjacent spacer;
    filling the first recesses with source material and covering the source material with first dielectric material;
    removing the mandrels and forming, where the mandrels are removed, second recesses through the top surface of the substrate;
    filling the second recesses with drain material and covering the drain material with second dielectric material;
    removing the spacers to form a plurality of openings to expose a portion of the top surface of the substrate, each opening having sidewalls defined by first and second dielectric material;
    forming in each opening a gate structure on the sidewalls of the first and second dielectric material and on an exposed portion of the top surface of the substrate;
    removing the first and second dielectric material; and
    depositing, where the first and the second dielectric material is removed, source and drain contacts to the source material and the drain material, respectively.

2. The method of claim 1, where the source material is comprised of a first doped semiconductor material having a first doping type and where the drain material is comprised of a second doped semiconductor material having a second doping type opposite to the first doping type.

3. The method of claim 1, where the source material is comprised P+SiGe doped with Boron.

4. The method of claim 1, where the drain material is comprised N+Si doped with Phosphorus.

5. The method of claim 1, where the gate structure is comprised of a layer of gate dielectric and a gate conductor disposed on the layer of gate dielectric.

6. The method of claim 1, where the gate structure has a length between the source region and the drain region in a range of about 10 nm to about 30 nm, where the source region has a width in a range of about 10 nm to about 30 nm, and where the drain region has a width in a range of about 10 nm to about 30 nm.

7. The method of claim 1, where the mandrels are comprised of a dielectric material.

8. The method of claim 1, where the mandrels are comprised of amorphous carbon (aC).

9. The method of claim 1, where the mandrels are removed by an etching process that is selective to the spacers and to the substrate.

10. The method of claim 1, where the spacers are removed by an etching process that is selective to the first dielectric material and the second dielectric material and to the substrate.

11. The method of claim 1, where the spacers are comprised of a nitride and where the first dielectric material and the second dielectric material are each comprised of an oxide.

12. The method of claim 1, where forming first recesses through the top surface of the substrate forms the first recesses so as to have a plurality of non-vertical sidewalls configured, when the first recesses are filled with the source material, to apply stress to an adjacent region of the semiconductor substrate wherein the channel is located.

13. The method of claim 1, where a gate length of each of the FETs is in a range of about 10 nm to about 30 nm.

14. The method as in claim 1, where each of the FETs is a tunnel FET (TFET) wherein the source region and the drain region have opposite doping polarities.

15. The method as in claim 1, where each of the FETs is a MOSFET wherein the source region and the drain region have the same doping polarity.

* * * * *